(12) United States Patent
Brau et al.

(10) Patent No.: US 8,076,938 B2
(45) Date of Patent: Dec. 13, 2011

(54) SYSTEM AND METHOD OF PARALLEL IMAGING WITH CALIBRATION TO A VIRTUAL COIL

(75) Inventors: Anja C. S. Brau, Menlo Park, CA (US); Philip James Beatty, Menlo Park, CA (US)

(73) Assignee: General Electric Company, Shenectady, NY (US)

( * ) Notice: Subject to any disclaimer, the term of this patent is extended or adjusted under 35 U.S.C. 154(b) by 190 days.

(21) Appl. No.: 12/415,948

(22) Filed: Mar. 31, 2009

(65) Prior Publication Data

US 2010/0244825 A1 Sep. 30, 2010

(51) Int. Cl.
*G01V 3/00* (2006.01)
(52) U.S. Cl. .......................... 324/309; 324/307
(58) Field of Classification Search .......... 324/300–322; 600/410–435
See application file for complete search history.

(56) References Cited

U.S. PATENT DOCUMENTS

| | | | |
|---|---|---|---|
| 5,587,656 A | 12/1996 | Van Heels-Burgen et al. |
| 5,600,244 A | 2/1997 | Jensen et al. |
| 6,289,232 B1 | 9/2001 | Jakob et al. |
| 6,841,998 B1 | 1/2005 | Griswold |
| 7,197,353 B2 | 3/2007 | King et al. |
| 7,279,895 B2 | 10/2007 | Wang et al. |
| 7,492,153 B2 | 2/2009 | Brau et al. |

OTHER PUBLICATIONS

M. Blaimer, M. Gutberlet, P. Kellerman, F.A. Breuer, H. Kostler, M.A. Griswold, "Virtual Coil Concept for Improved Parallel MRI Employing Conjugate Symmetric Signals," Magnetic Resonance in Medicine, 61:93-102 (2009).
Blaimer M., Kostler H, Kellman P., Griswold MA, "Conjugate Symmetry for Improved Parallel Imaging with GRAPPA," ISMRM 2007.
K.P. Pruessmann et al, "SENSE: Sensitivity Enciding for Fast MRI," MRM 42:952-962, 1999.
M.A. Griswold et al. "Generalized Autocalibrating Partially Parallel Acquisitions (GRAPPA)," MRM 47:1202-1210, 2002.
M.A. Griswold et al., "Field-of-View Limitations in Parallel Imaging," MRM 52:118-1126, 2004.
R.M. Heidemann et al., "VD-Auto-Smash Imaging," MRM 45:1066-1074, 2001.
A.C. Brau et al., "Efficient Computation of Autocalibrating Parallel Imaging Reconstructions," ISMRM 2006.

*Primary Examiner* — Dixomara Vargas

(57) ABSTRACT

A method for generating a magnetic resonance (MR) image includes acquiring calibration data from each of a plurality of RF source coils. Calibration data for a virtual coil is generated based on the calibration data from the plurality of RF source coils and a set of synthesis weights is generated based on the calibration data from the plurality of RF source coils and the calibration data for the virtual coil. Accelerated MR data is acquired from each of the plurality of RF source coils. An image can be reconstructed based on an application of the set of synthesis weights to the accelerated MR data from the plurality of RF source coils.

30 Claims, 9 Drawing Sheets

SYSTEM AND METHOD OF PARALLEL IMAGING WITH CALIBRATION TO A VIRTUAL COIL

TECHNICAL FIELD

The present invention relates generally to magnetic resonance imaging (MRI) systems and in particular, to a system and method for sampling and reconstructing an image of an imaging volume using multiple receiver coils.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). A MRI system also comprises components called gradient coils that produce smaller amplitude, spatially varying magnetic fields when current is applied to them. Typically, gradient coils are designed to produce a magnetic field component along the z axis and that varies linearly in amplitude with position along one of the x, y or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

One technique that has been developed to accelerate MR data acquisition is commonly referred to as "parallel imaging" or "partially parallel imaging." In parallel imaging, multiple receive coils acquire data from a region or volume of interest. Thus, parallel imaging is used to accelerate data acquisition in one or more dimensions by exploiting the spatial dependence of phased array coil sensitivity. Parallel imaging has been shown to be successful in reducing scan time, image blurring and geometric distortions. Moreover, parallel imaging can be used to improve spatial or temporal resolution as well as increased volumetric coverage.

There are several types of parallel imaging (PI) reconstruction methods that have been developed to generate the final, unaliased image from accelerated data. These methods can generally be divided into two categories based on how they treat the reconstruction problem: 1) SENSE-based techniques (Sensitivity Encoding) estimate coil sensitivity profiles from low-resolution calibration images, which can then be used to unwrap aliased pixels in image space using a direct inversion algorithm; and 2) autocalibrating PI-based methods, such as GRAPPA (Generalized Auto-calibrating Partially Parallel Acquisition) and ARC (Autocalibrating Reconstruction for Cartesian sampling), that calculate reconstruction weights necessary to synthesize unacquired data from acquired data using an algorithm that does not require coil sensitivity estimates. The reconstruction weights for GRAPPA and ARC are calculated from a small amount of fully sampled calibration data that is typically embedded within the scan ("auto-calibration"), but can also be acquired before or after the scan. Thus, GRAPPA and ARC exploit receiver coil sensitivity variation to accelerate data acquisition and synthesize the missing data using pre-calculated calibration information obtained from the particular imaging setup. While both SENSE- and autocalibrating PI-based approaches have been successful, in practice, autocalibrating PI-based techniques have been shown to be preferred when accurate coil sensitivity estimates cannot be obtained, for example, in reduced FOV applications, and because they exhibit relatively benign image artifacts across a variety of applications.

Per-coil reconstructions can be used with autocalibrating PI techniques to eliminate the phase-cancellation artifacts that can result from poor coil combination. However, a disadvantage of per-coil autocalibrating PI techniques is that they are computationally expensive because a complete dataset for each receiver coil is reconstructed from the accelerated data from that coil and the accelerated data from at least one other coil. The linear combination weights needed to perform the reconstruction are calculated during an initial training phase. The training phase is performed using a small amount of fully sampled calibration data that is acquired on each receiver coil either before, during, or after the accelerated scan. Reconstruction weights can be determined by fitting the calibration data from all coils to the calibration data on a single coil in the group. This process can be repeated for each coil in the group.

In other words, for various autocalibrating PI techniques, each individual coil dataset is reconstructed using information from a plurality of coils. The multiple separate coil images can then be combined via a sum-of-squares reconstruction to create a final composite image. While performing a per-coil reconstruction eliminates the phase cancellation problems observed in implementations such as VD-AUTO-SMASH, it introduces a significant computation burden. Specifically, the computational expense of autocalibrating PI techniques is proportional to $N_c^2$, where $N_c$ is the number of surface coils. Thus, computation time scales exponentially as the number of coils increases.

It would be desirable to provide a system and method for sampling and reconstruction of an image using parallel imaging that improves computational efficiency and maintains good image quality.

BRIEF DESCRIPTION OF THE INVENTION

In accordance with an embodiment, a magnetic resonance imaging (MRI) system includes a resonance assembly comprising a plurality of gradient coils and a plurality of RF source coils, an RF transceiver system coupled to the plurality of RF source coils and configured to receive magnetic resonance (MR) data from the plurality of RF source coils and a controller programmed to receive MR data of an imaging subject from each of the plurality of RF source coils, generate MR data for a virtual coil, determine a set of weights based on the MR data received from each RF source coil and the MR data generated for the virtual coil, generate a complete MR data set for the virtual coil based only on at least a portion of the MR data from at least two of the RF source coils and the set of weights and reconstruct an image based on the complete MR data set for the virtual coil.

In accordance with another embodiment, a method for generating a magnetic resonance (MR) image includes acquiring calibration data from each of a plurality of RF source coils, generating calibration data for a virtual coil based on the calibration data from the plurality of RF source coils, generating a set of synthesis weights based on the calibration data from the plurality of RF source coils and the calibration data for the virtual coil, acquiring accelerated MR data from each of the plurality of RF source coils, generating a complete MR data set for the virtual coil based only on the accelerated MR data from at least two of the RF source coils and the set of synthesis weights, and reconstructing an image based on the complete MR data set for the virtual coil.

In accordance with another embodiment, a computer readable storage medium having a program stored thereon that when executed by a processor causes the processor to access MR data of an imaging subject acquired from each of at least two RF source coils, generate MR data for a virtual coil, determine a set of linear combination weights based on the MR data from the at least two RF source coils and the MR data for the virtual coil, generate a complete MR data set for the virtual coil based only on the MR data from the at least two RF source coils and the set of linear combination weights, and reconstruct an image based on the complete MR data set for the virtual coil.

In accordance with another embodiment, a method for generating a magnetic resonance (MR) image includes acquiring calibration data from each of a plurality of RF source coils, generating calibration data for a virtual coil based on the calibration data from the plurality of RF source coils, generating a set of synthesis weights based on the calibration data from the plurality of RF source coils and the calibration data for the virtual coil, accessing accelerated MR data associated with the plurality of RF source coils, generating a complete MR data set for the virtual coil based only on the accelerated MR data associated with the plurality of RF source coils and the set of synthesis weights, and reconstructing an image based on the complete MR data set for the virtual coil.

BRIEF DESCRIPTION OF THE DRAWINGS

Embodiments are illustrated by way of example and not limitation in the figures of the accompanying drawings, in which like reference numerals indicate corresponding, analogous or similar elements, and in which.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

Figure 1:
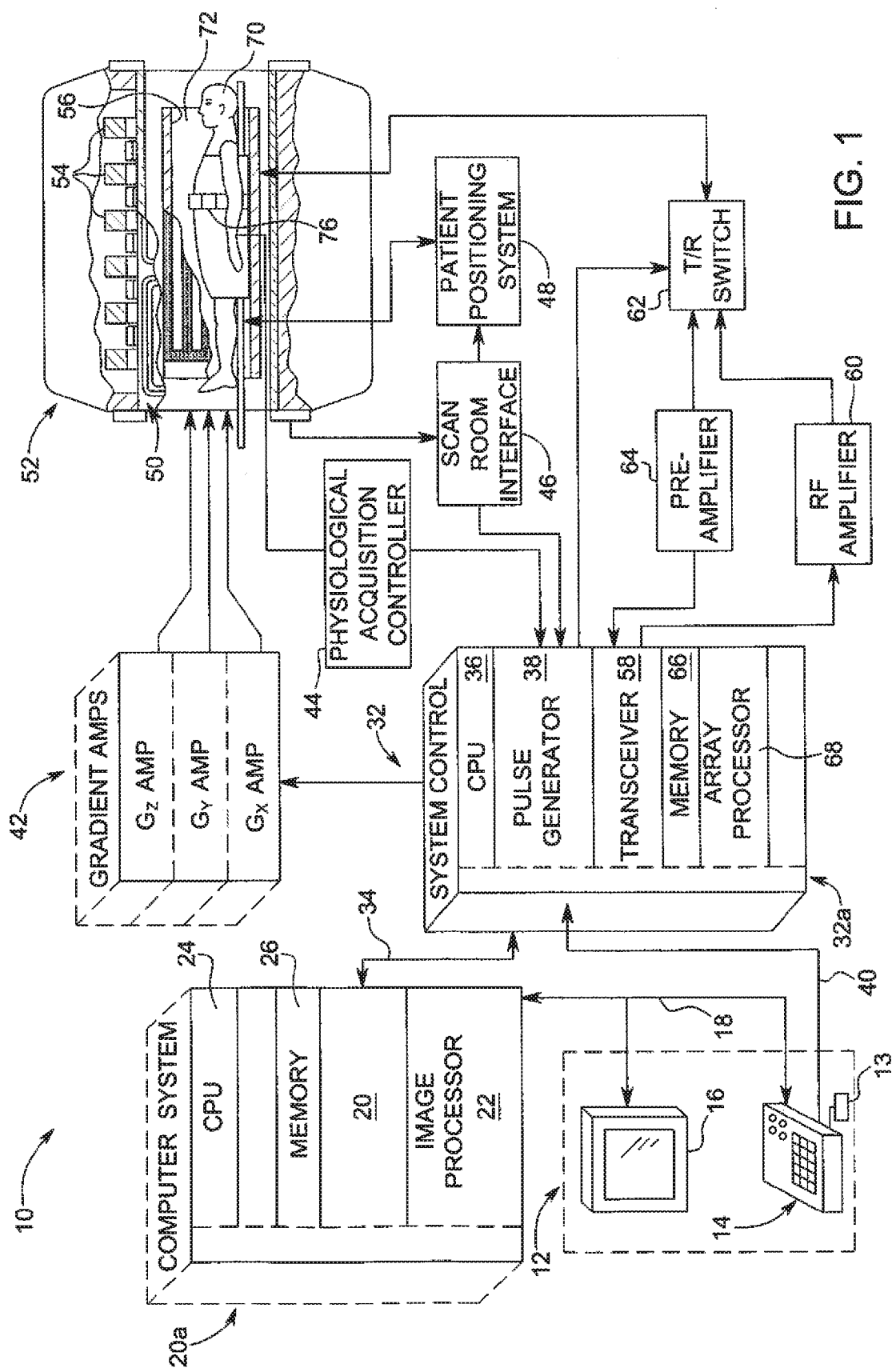
FIG. 1 is a schematic block diagram of an exemplary magnetic resonance imaging system in accordance with an embodiment.

FIG. 1 is a schematic block diagram of an exemplary magnetic resonance imaging system in accordance with an embodiment. The operation of MRI system 10 is controlled from an operator console 12 that includes a keyboard or other input device 13, a control panel 14 and a display 16. The console 12 communicates through a link 18 with a computer system 20 and provides an interface for an operator to prescribe MRI scans, display the resultant images, perform image processing on the images, and archive data and images. The computer system 20 includes a number of modules that communicate with each other through electrical and/or data connections, for example such as are provided by using a backplane 20a. Data connections may be direct wired links or may be fiber optic connections or wireless communication links or the like. The modules of computer system 20 may include an image processor module 22, a CPU module 24 and a memory module 26 that may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer systems or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms which control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of Gx, Gy and Gz amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet 54 and a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the magnet assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the coil during the receive mode. The transmit/receive switch 62 can also enable a separate RF coil (for example, a parallel or surface coil 76) to be used in either the transmit or receive mode.

The MR signals sensed by the RF coil 56 are digitized by the transceiver module 58 and transferred to a memory module 66 in the system control computer 32. Three dimensional (3D) MRI data is typically collected in a 3D Fourier space known in imaging as "k-space," a reciprocal space connected to real space via a Fourier transform. Typically, each MR signal, or "view," is encoded with a particular spatial frequency using "phase-encoding" and "slice-encoding" gradient pulses. For example, in a 3D Cartesian acquisition of MRI data, two directional phase encodings may be performed that correspond to a phase-encoding axis ($k_y$) and a slice-encoding axis ($k_z$). K-space is sampled by acquiring multiple phase- and slice-encoded views, each of which is defined by a unique $k_y$, $k_z$, position in the $k_y$-$k_z$ plane. The acquired data is deposited in the k-space matrix in a row, specifically determined by the frequency and phase encode gradient strengths applied during MR signal evolution. Each view may acquire all the $k_x$ data for a specific pair of phase-encoding and slice-encoding values (i.e., each view may acquire all of the $k_x$ data required for its $k_y$, $k_z$ position). In another example, for a 2D spectroscopic acquisition ($k_x$, $k_y$, f), each view corresponds to a single $k_x$ and $k_y$ value, but contains data for the full range of chemical shift frequencies required to reconstruct a spectroscopic image. Multiple such digitized views are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long term storage or it may be further processed by the image processor 22 and conveyed to the operator console 12 and presented on display 16.

Figure 2:
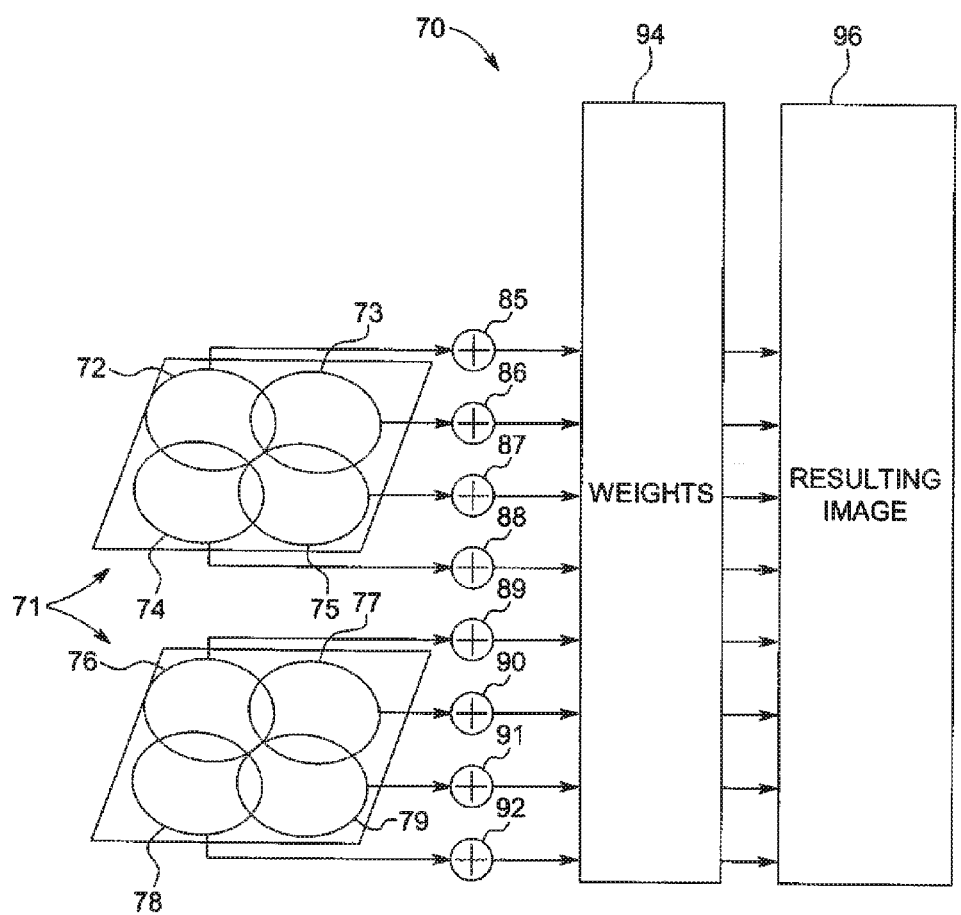
FIG. 2 is a schematic diagram of an RF coil array useful in an autocalibrating parallel imaging technique in accordance with an embodiment.

Referring now to FIG. 2, a schematic representation of an RF coil array 70 useful in an autocalibrating parallel imaging technique according to an embodiment is illustrated. RF coil array 70 includes an array of source coils 71 used to acquire calibration and imaging data for a field of view (FOV) and includes eight separate surface coil elements 72-79. It is contemplated, however, that the array of source coils 71 may include more or less than eight coil elements. The number of separate coil elements 72-79 shown in FIG. 2 is merely an illustrative example, and the present invention is not limited to only the number of separate coil elements shown. In a preferred embodiment, the imaging data represents data from a reduced FOV. Each coil element 72-79 samples the FOV by detecting changes in excited nuclei in the FOV and transmits signals indicative of that which is detected to separate data acquisition channels 85-92, respectively. In one embodiment, calibration data from each channel 85-92 is used to generate calibration data for at least one virtual coil as described in more detail below. The calibration data from the data acquisition channels 85-92 and the synthesized virtual coil calibration data are used to generate synthesis or linear combination weights 94. Thereafter, a respective coil image 96 for the virtual coil is calculated using the synthesis weights 94 for the virtual coil and imaging data acquired in coil elements 72-79 of the array of source coils 71. One skilled in the art will appreciate that the array of receiver RF coils illustrated in FIG. 2 is exemplary and many other receiver coil array geometries may be used in accordance with embodiments.

Figure 3:
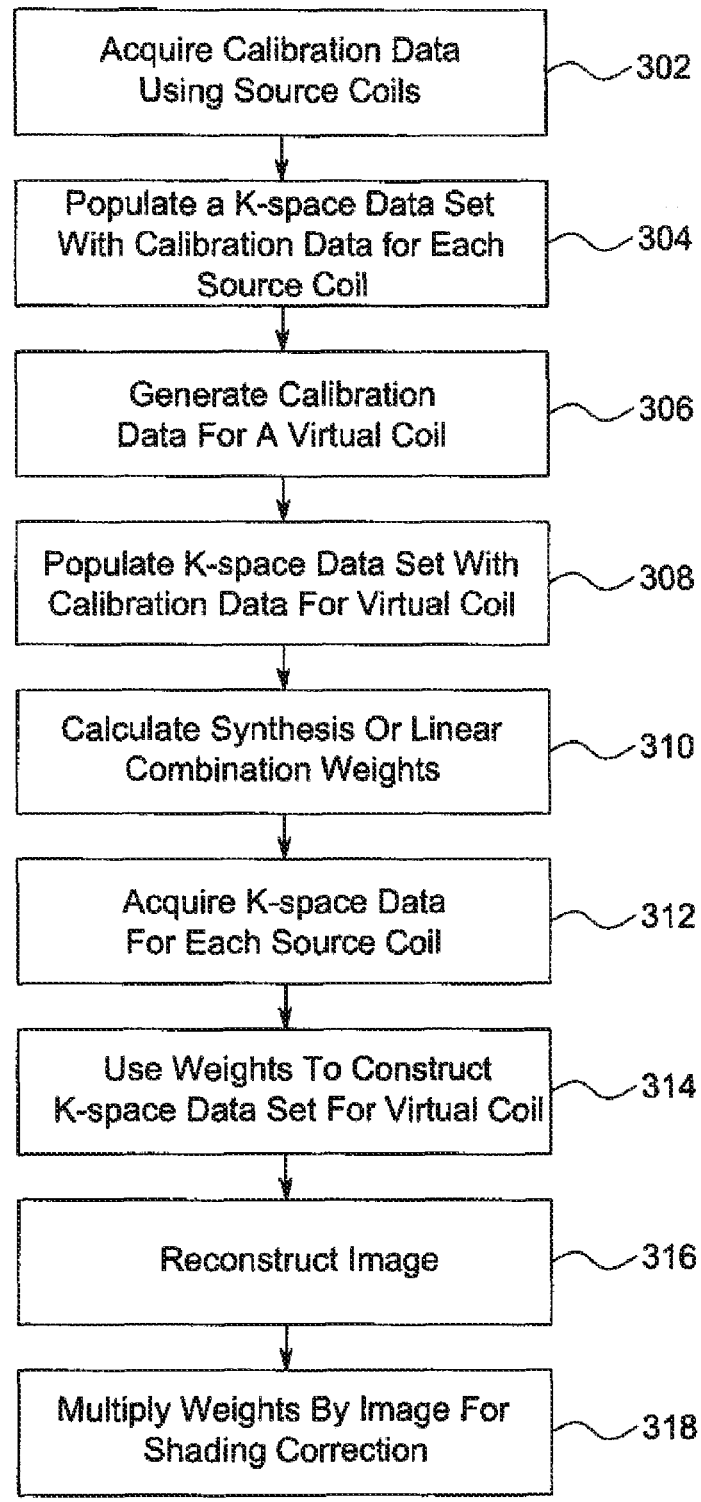
FIG. 3 illustrates an autocalibrating parallel imaging technique in accordance with an embodiment.
Figure 4:
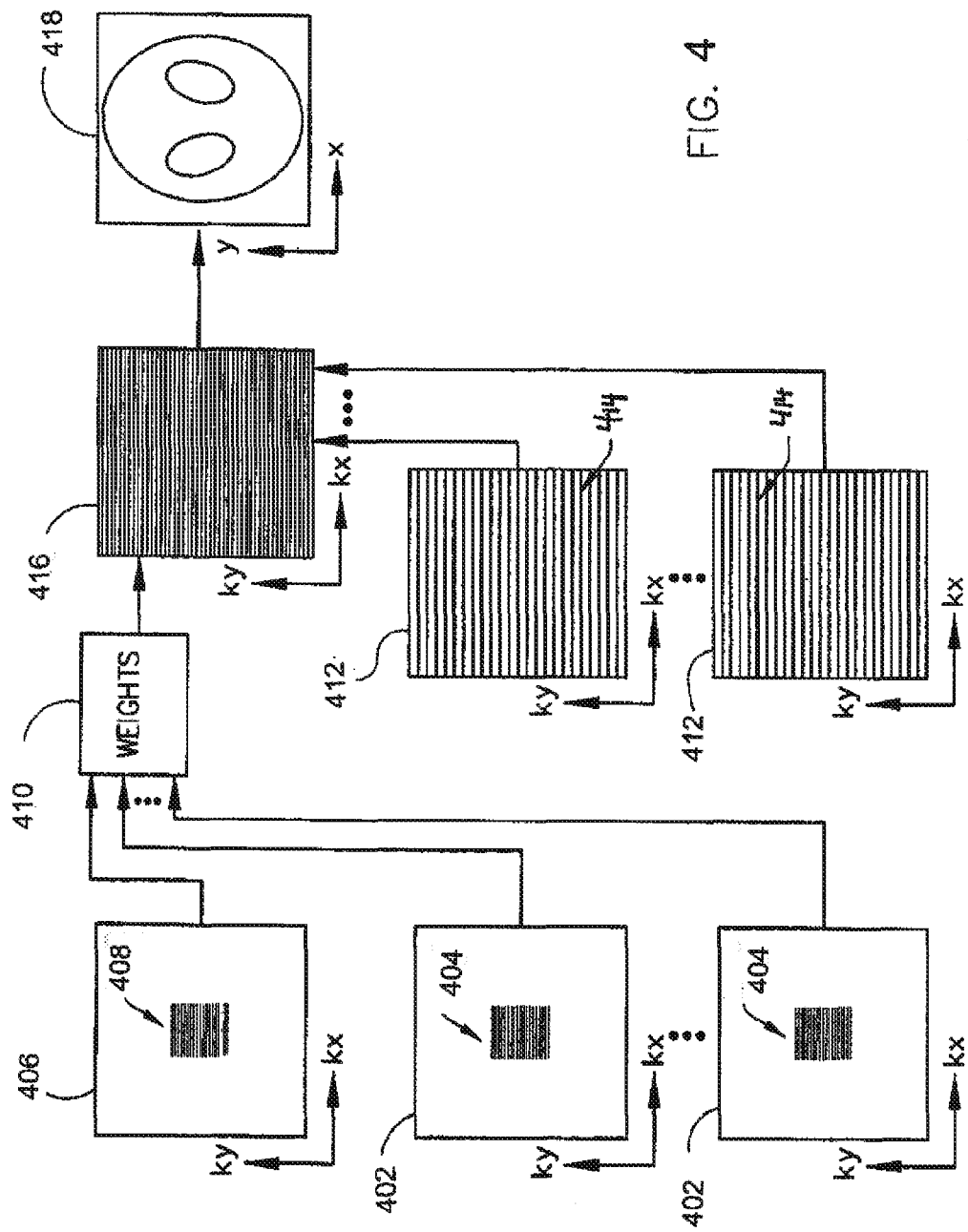
FIG. 4 is a schematic diagram of the autocalibrating parallel imaging technique of FIG. 3 in accordance with an embodiment.

Referring now to FIGS. 3 and 4, FIG. 3 illustrates an autocalibrating parallel imaging technique in accordance with an embodiment and FIG. 4 is a schematic diagram of the autocalibrating parallel imaging technique of FIG. 3 in accordance with an embodiment. At block 302, k-space calibration data 404 (shown in FIG. 4) is acquired in a plurality of source coils (e.g., source coils 72-79 shown in FIG. 2). Magnetic spins of an imaging object or subject, such as the subject shown in FIG. 1, are excited such that a large signal may be acquired therefrom. Thereafter, at block 304, a k-space data set 402 (shown in FIG. 4) for each source coil is populated with the low resolution, full FOV k-space calibration data 404 having a high signal-to-noise ration (SNR) acquired in the respective source coil 402.

Figure 5:
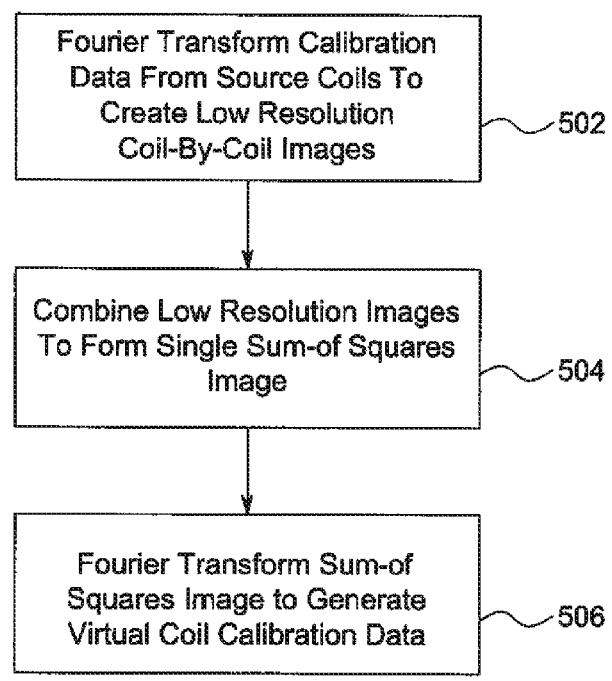
FIG. 5 illustrates a method for generating calibration data for a virtual coil in accordance with an embodiment.

At block 306, k-space calibration data 408 (shown in FIG. 4) is generated or synthesized for a virtual coil. The virtual coil is not an actual physical coil used to acquire data but rather an imaginary coil having coil sensitivity with a desired profile (e.g., uniform across the FOV). A method or technique for generating the calibration data 408 for the virtual coil is shown in FIG. 5. At block 502, the calibration data 404 from the source coils is Fourier transformed to create low resolution coil-by-coil images. At block 504, the low resolution images are combined to form a single sum-of-squares image with an added spatially varying phase based on the low resolution coil-by-coil images. At block 506, the low resolution sum-of-squares image with phase correction is Fourier transformed to generate the virtual coil k-space calibration data 408 for the virtual coil. Returning to FIG. 3, at block 308, a k-space data set 406 (shown in FIG. 4) for the virtual coil is populated with the virtual coil calibration data 408.

Figure 6:
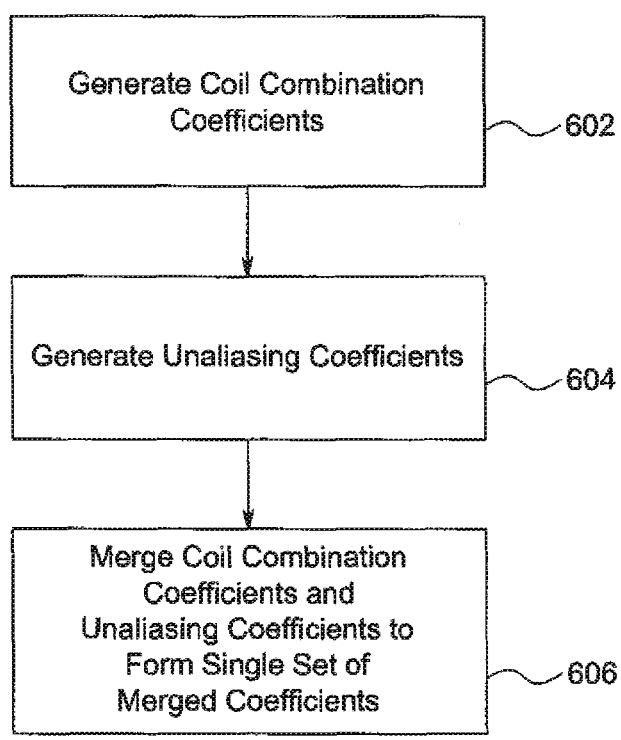
FIG. 6 illustrates a method for calculating a set of merged coefficients or weights in accordance with an embodiment.
Figure 7:
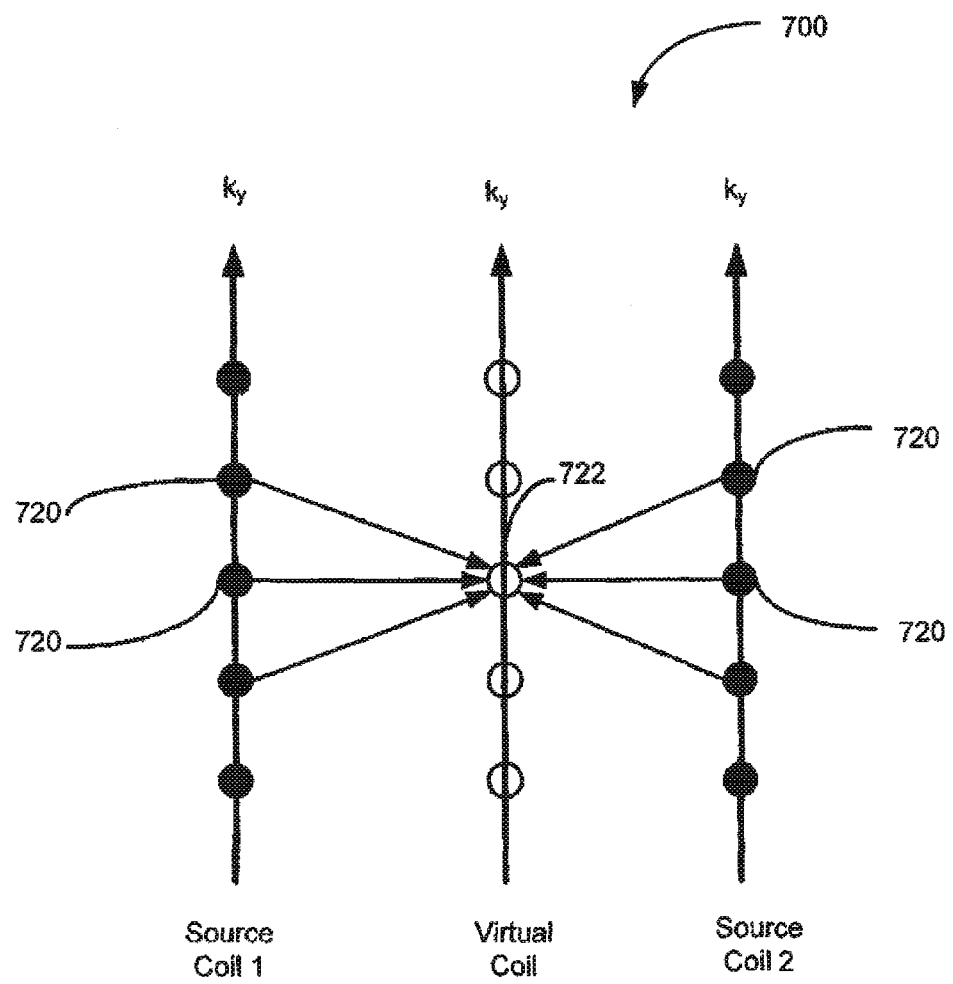
FIG. 7 shows an exemplary method for generating a set of coil combination coefficients in accordance with an embodiment.

At block 310, synthesis or linear combination weights 410 (shown in FIG. 4) are calculated. The weights 410 are used to synthesize k-space data for the virtual coil from k-space data on the source coils. In one embodiment, the weights are merged coefficients. FIG. 6 illustrates a method for calculating a set of merged coefficients or weights in accordance with an embodiment. At block 602, a set of coil combination coefficients for the virtual coil are generated using known methods. For example, in one embodiment, the coil combination coefficients can be generated by relating the calibration data 404 from the source coils to the virtual coil calibration data 408. For example, unaccelerated calibration data from the source coils can be fit to the virtual coil calibration data (the target data) as illustrated in FIG. 7. A one-dimensional (1D) kernel 700 is shown in FIG. 7 for illustration. Source data 720 from the source coils are fit, according to known methods, to the target data 722 (e.g., the virtual coil calibration data) to generate coil combination coefficients. While FIG. 7 shows a 1D kernel for illustration, the kernel can span all spatial frequency directions.

Figure 8:
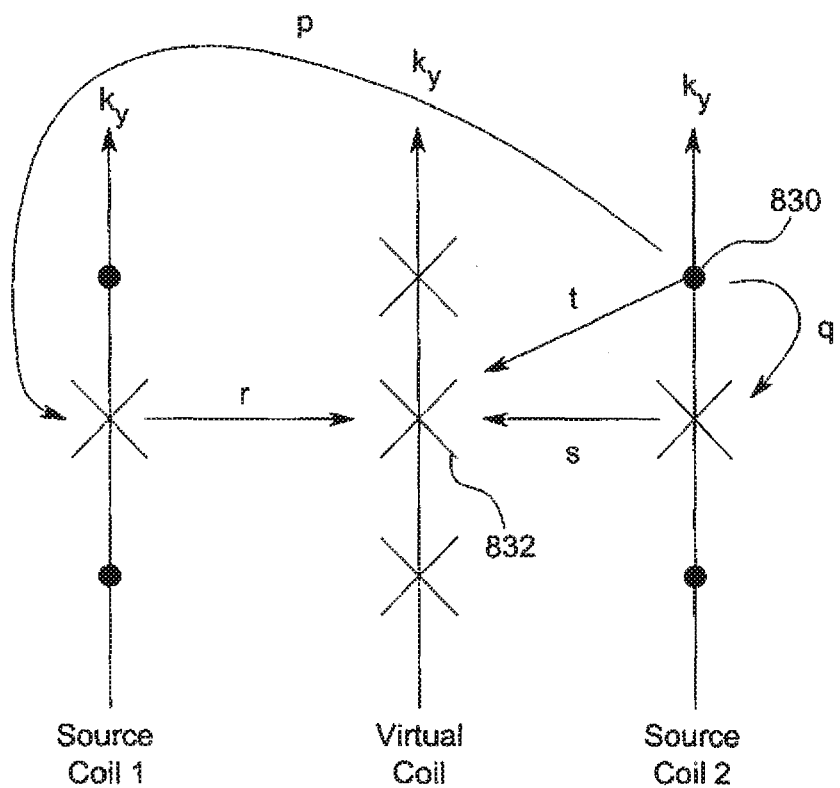
FIG. 8 illustrates coil combination coefficient and unaliasing coefficient paths.
Figure 9:
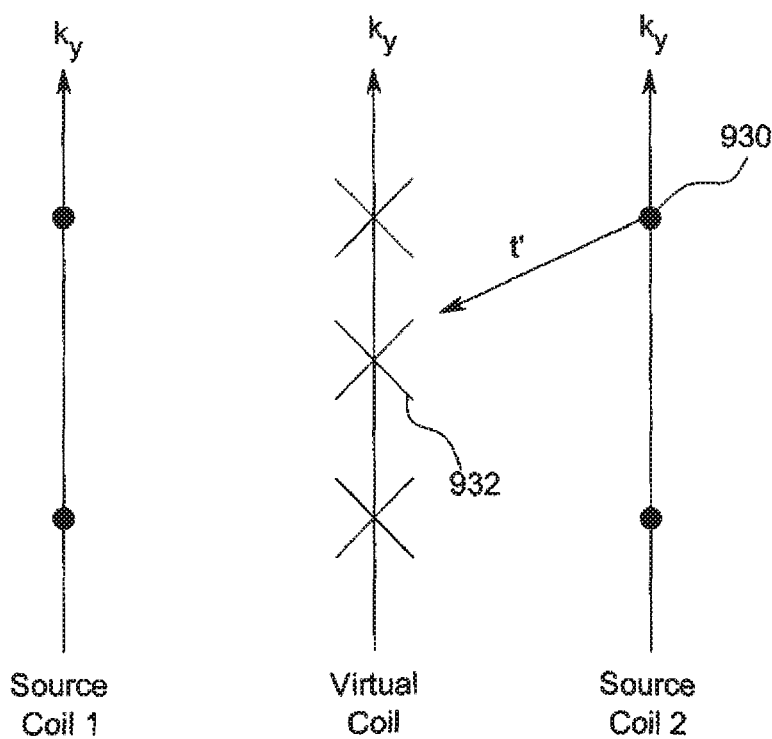
FIG. 9 illustrates merging the coil combination and unaliasing coefficients in accordance with an embodiment.

Returning to FIG. 6, at block 604 a set of unaliasing coefficients for the virtual coil are generated using known methods. For example, the unaliasing coefficients can be generated using the ARC (Auto-Calibrating Reconstruction for Cartesian sampling) method, for example, as described in "Comparison of Reconstruction Accuracy and Efficiency Among Autocalibrating Data-Driven Parallel Imaging Methods," A. Brau, P. Beatty, S. Skare, R. Bammer, Magnetic Resonance in Medicine, Volume 59, Issue 2, February 2008, pgs. 382-395 and "A Method For Autocalibrating 2D-Accelerated Volumetric Parallel Imaging with Clinically Practical Reconstruction times, Beatty P., Brau A C S, Chang S, Joshi S M, Michelich C R, Bayram E, Nelson T E, Herfkens R J, Brittain J H, ISMRM 2007, 1749, both of which are herein incorporated by reference. Once the coil combination coefficients and the unaliasing coefficients are generated, the coil combination coefficients and the unaliasing coefficients are merged at block 606 to form a single set of merged coefficients that are used as weights 410. FIG. 8 illustrates the coil combination coefficient (r, s, t) and unaliasing coefficient (p,q) paths. In FIG. 8, a datum 830 from a source coil contributes to a virtual coil datum 832 via multiple paths, namely, pr, qs, and t. The multiple paths (pr, qs, t) can be combined into a single "merged" coefficient. FIG. 9 illustrates merging the coil combination coefficients and unaliasing coefficients in accordance with an embodiment. As shown in FIG. 9, a datum 930 from the source coil contributes to a virtual coil datum 932 via a single path, t', using a single merged coefficient represented by t'=pr+qs+t.

Returning to FIG. 3, in an alternative embodiment, the synthesis or linear combination weights 410 (shown in FIG. 4) are generated directly at block 310 by fitting the calibration data 404 from each source coil to the calibration data 408 of the virtual coil according to known methods. In another embodiment, it is envisioned that linear combination weights can be generated from complex valued numbers, identified herein as "correlation values." Correlation values are generated by way of an intermediate calculation that is performed using the calibration data. That is, a correlation value is generated that relates two encoding locations (or encoding vectors) to each other, the encoding locations being selected from calibration data that has been plotted in k-space on a kx-ky plane. Each encoding location is specified by a pair of values (j, k), that are defined by an integer coil index, j, that corresponds with a specified receiver coil in the RF coil array, and a k-space location, k. These correlation values are entered into one or more systems or linear equations to determine the linear combination weights.

At block 312, k-space data sets 412 (shown in FIG. 4) are acquired and populated for each source coil. Magnetic spins of the imaging object are excited such that signals acquired therefrom have a diagnostically useful contrast that may have a different signal-to-noise ratio (SNR) and/or contrast than the signals from which calibration data is acquired. Thereafter, each k-space data set 412 is populated with full resolution, reduced FOV data 414 (shown in FIG. 4) acquired in an accelerated scan. It is contemplated that the reduced FOV accelerated data sets 414 may be acquired before, during or after acquisition of the calibration data. In one embodiment, the k-space data 414 and the calibration data 404 are simultaneously acquired in a combined acquisition from each source coil.

At block 314, the weights 410 are used to construct a full resolution, full FOV k-space data set 416 (shown in FIG. 4) for the virtual coil. The weights 410 are applied to the accelerated data 414 from each source coil to directly synthesize a complete virtual coil data set 416. In an embodiment, the virtual coil k-space data set 416 is generated from a linear combination of the application of the weights 410 to the data 414 in each full resolution, reduced FOV k-space data set 412 for each source coil. Thereafter, at block 316, a Fourier transform in one or more dimensions is applied to the virtual coil k-space data set 416 to reconstruct an image 418. At block 318, the weights 410 may be applied (e.g., multiplied) to the image 418 to provide shading correction (e.g., to correct the overall shading envelope).

In alternative embodiments, the accelerated data sets 412 may include at least one synthetic source coil accelerated data set that is generated from acquired accelerated data from one or more of the physical source coils. For example, in an embodiment where thirty-two (32) physical source coils are included in the RF coil array, the data acquired from the 32 physical source coils may be used to generate twenty (20) synthetic source coil accelerated data sets. The synthesis weights can the be applied to the 20 synthetic source coil data sets to generate the full k-space data set for the virtual coil.

Figure 10:
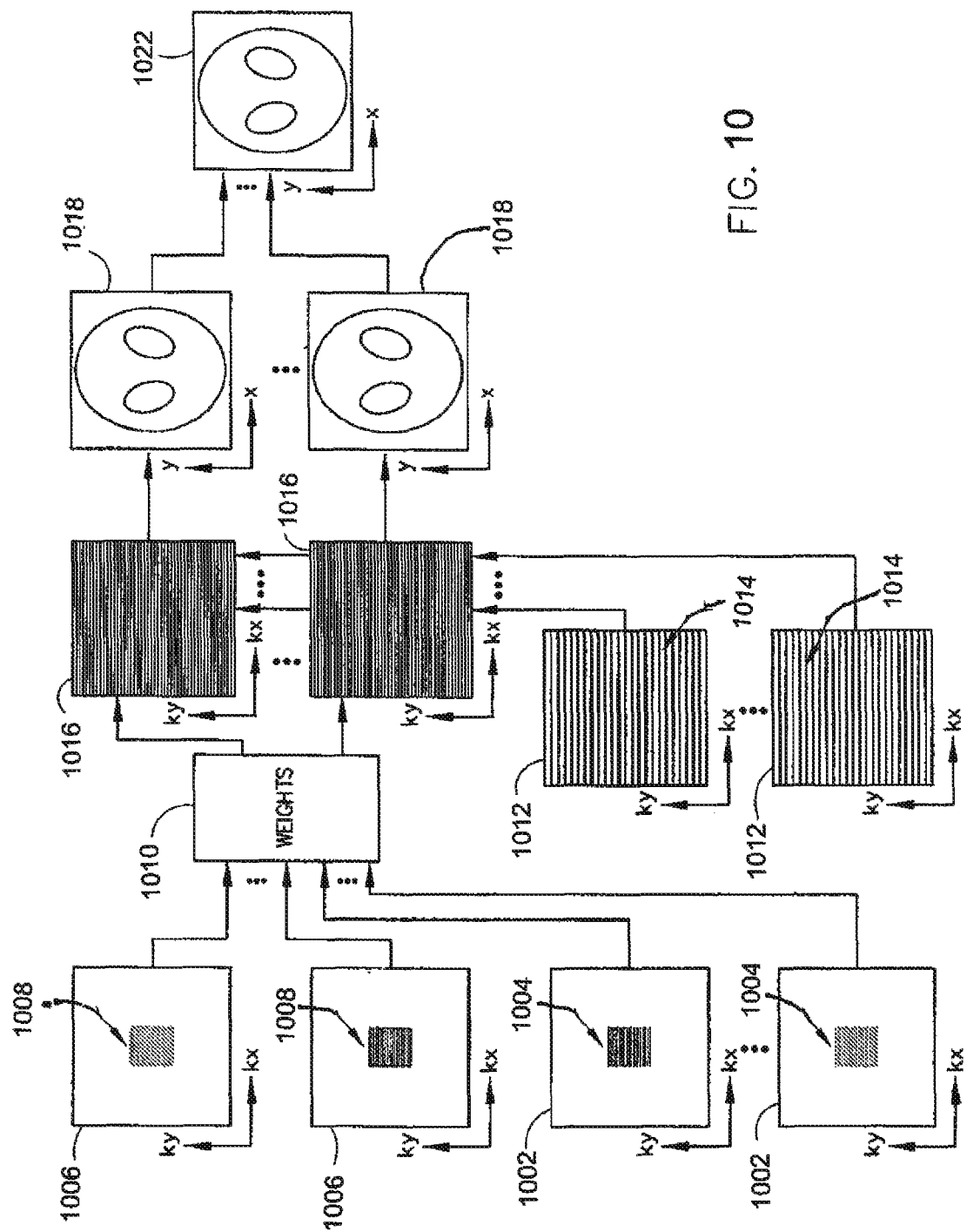
FIG. 10 is a schematic diagram of an autocalibrating parallel imaging technique in accordance with an alternative embodiment.

In another alternative embodiment, an image may be generated for more than one virtual coil. FIG. 10 is a schematic diagram of an autocalibrating parallel imaging technique in accordance with an alternative embodiment. The technique shown in FIG. 10 is similar to that shown in FIG. 4 with the addition of multiple virtual coils. Each virtual coil may have a different coil sensitivity with a desired profile (e.g., a first virtual coil may have a coil sensitivity profile for an upper half of an image and a second virtual coil may have a coil sensitivity profile for a lower half of an image). For each virtual coil, a respective k-space data set 1006 is populated with synthesized calibration data 1008. Calibration data 1008 for each virtual coil may be generated as described above with respect to FIGS. 3 and 4 from calibration data 1004 acquired from each source coil. The synthesis weights 1010 include weights calibrated from a relationship between the calibration data 1004 from each source coil to the calibration data 1008 of each virtual coil. A full resolution, full FOV k-space data set 1016 is constructed for each virtual coil and a 2D Fourier transform is applied to the k-space data sets 1016 to reconstruct an image 1018 for each virtual coil. The image 1018 from each virtual coil may be combined into a single, composite image 1022 using one of a number of known summation techniques, e.g., sum-of-squares.

In another embodiment, it is envisioned that unacquired MR data for the virtual coil is filled-in in hybrid space.

"Hybrid space" refers to the intermediate matrix that results in the performance of one of the 1D Fourier transforms that comprise the 2D Fourier transform that converts k-space to image space. In other words, in 2D Fourier imaging, one Fourier transform is performed in the frequency encoding direction and another Fourier transform is performed in the phase encoding direction. The matrix after the first 1D Fourier transform is considered a "hybrid space." That is, the data is no longer "untransformed" and therefore not considered k-space; however, the data, as a whole, is not yet in the spatial domain and, thus, not in "image space."

Upon generation of the linear coefficient weights as described above with respect to FIGS. 3 and 4, the weights are transformed into hybrid-space weights to be applied to imaging data that has been similarly transformed into hybrid space. That is, the linear coefficient weights are Fourier transformed in one dimension (typically, the frequency-encode direction) to form a set of hybrid weights. The k-space data sets from the source coils are Fourier transformed in the one dimension to generate hybrid-space data sets. A hybrid space data set for the virtual coil is generated by synthesizing missing data using the hybrid space data sets for the source coils and the hybrid space weights. The virtual coil hybrid space data set can then be reconstructed to an image, by application of a 1D Fourier transform in each phase encoding direction.

A technical effect of the disclosed method and system is a reduction in reconstruction time for an image including improved computational efficiency.

Computer-executable instructions for generating a magnetic resonance (MR) image according to the above-described method may be stored on a form of computer readable media. Computer readable media includes volatile and non-volatile, removable and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by MRI system 10 (shown in FIG. 1), including by internet or other computer network forms of access.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A magnetic resonance imaging (MRI) system comprising:
   a resonance assembly comprising a plurality of gradient coils and a plurality of RF source coils;
   an RF transceiver system coupled to the plurality of RF source coils and configured to receive magnetic resonance (MR) data from the plurality of RF source coils; and
   a controller programmed to:
      receive MR data of an imaging subject from each of the plurality of RF source coils;
      generate MR data for a virtual coil;
      determine a set of weights based on the MR data received from each RF source coil and the MR data generated for the virtual coil;
      generate a complete MR data set for the virtual coil based only on at least a portion of the MR data from at least two of the RF source coils and the set of weights; and
      reconstruct an image based on the complete MR data set for the virtual coil.

2. An MRI system according to claim 1, wherein generating a complete MR data set for the virtual coil comprises applying the set of weights to the at least a portion of the MR data from at least two of the RF source coils.

3. An MRI system according to claim 1, wherein the MR data received from each of the plurality of RF source coils comprises calibration data.

4. An MRI system according to claim 3, wherein the MR data generated for the virtual coil comprises calibration data.

5. An MRI system according to claim 4, wherein generating the MR data for the virtual coil comprises:
   transforming the calibration data from each source coil to form a low resolution image;
   combining the low resolution images for the plurality of source coils to form a single combined image; and
   inverse transforming the combined image to generate the calibration data for the virtual coil.

6. An MRI system according to claim 4, wherein the set of weights is determined based on the calibration data from each of the plurality of source coils and the calibration data for the virtual coil.

7. An MRI system according to claim 4, wherein the MR data received from each of the plurality of RF source coils further comprises a set of accelerated MR data.

8. An MRI system according to claim 7, wherein the set of weights are applied to the set of accelerated MR data from each source coil to generate the complete MR data set for the virtual coil.

9. An MRI system according to claim 1, wherein the set of weights is a set of merged coefficients.

10. An MRI system according to claim 9, wherein determining the set of merged coefficients comprises:
    calculating a set of coil combination coefficients;
    calculating a set of unaliasing coefficients; and
    combining the set of coil combination coefficients and the set of unaliasing coefficients to form a single set of coefficients.

11. A method for generating a magnetic resonance (MR) image comprising:
    acquiring calibration data using each of a plurality of RF source coils in a magnetic resonance imaging system;
    generating calibration data for a virtual coil based on the calibration data from the plurality of RF source coils;
    generating a set of synthesis weights based on the calibration data from the plurality of RF source coils and the calibration data for the virtual coil;
    acquiring accelerated MR data using each of the plurality of RF source coils;

generating a complete MR data set for the virtual coil based only on the accelerated MR data from at least two of the RF source coils and the set of synthesis weights;

reconstructing an image based on the complete MR data set for the virtual coil; and displaying the image on a display device.

12. A method according to claim 11, wherein generating a complete MR data set for the virtual coil comprises applying the set of synthesis weights to the accelerated MR data from at least two of the RF source coils.

13. A method according to claim 11, wherein generating a complete MR data set for the virtual coil comprises:

transforming the set of synthesis weights to hybrid space;

transforming the accelerated MR data from the at least two RF source coils to hybrid space; and applying the transformed set of synthesis weights to the transformed accelerated MR data from the at least two RF source coils to generate a complete hybrid space data set for the virtual coil.

14. A method according to claim 13, wherein reconstructing an image comprises reconstructing an image from the complete hybrid space data set for the virtual coil.

15. A method according to claim 11, wherein generating calibration data for the virtual coil comprises:

transforming the calibration data from each source coil to form a low resolution image;

combining the low resolution images for the plurality of source coils to form a single combined image; and inverse transforming the combined image to generate the calibration data for the virtual coil.

16. A method according to claim 11, wherein the set of synthesis weights is a set of merged coefficients.

17. A method according to claim 16, wherein generating a set of merged coefficients comprises:

calculating a set of coil combination coefficients;

calculating a set of unaliasing coefficients; and combining the set of coil combination coefficients and the set of unaliasing coefficients to form a single set of coefficients.

18. A non-transitory computer readable storage medium having a program for performing a method for generating a magnetic resonance MR image, the computer readable storage medium comprising:

program code for accessing MR data of an imaging subject acquired from each of at least two RF source coils;

program code for generating MR data for a virtual coil;

program code for determining a set of linear combination weights based on the MR data from the at least two RF source coils and the MR data for the virtual coil;

program code for generating a complete MR data set for the virtual coil based only on the MR data from the at least two RF source coils and the set of linear combination weights; and program code for reconstructing an image based on the complete MR data set for the virtual coil.

19. A non-transitory computer readable storage medium according to claim 18, wherein the MR data from the at least two RF source coils comprises calibration data and accelerated MR data.

20. A non-transitory computer readable storage medium according to claim 19, wherein generating MR data for the virtual coil comprises generating calibration data for the virtual coil based on the calibration data from the at least two RF source coils.

21. A non-transitory computer readable storage medium according to claim 20, wherein the set of linear combination weights are determined based on the calibration data from the at least two RF source coils and the calibration data generated for the virtual coil.

22. A non-transitory computer readable storage medium according to claim 19, wherein the complete MR data set for the virtual coil is generated based only on the accelerated data from the at least two RF source coils and the linear combination weights.

23. A non-transitory computer readable storage medium according to claim 22, wherein generating the complete MR data set for the virtual coil comprises applying the set of linear combination weights to the accelerated MR data from at least two of the RF source coils.

24. A non-transitory computer readable storage medium according to claim 18, wherein the set of linear combination weights is a set of merged coefficients.

25. A non-transitory computer readable storage medium according to claim 24, wherein determining the set of linear combination weights further comprises:

calculating a set of coil combination coefficients;

calculating a set of unaliasing coefficients; and combining the set of combination coefficients and the set of unaliasing coefficients to form a single set of coefficients.

26. A method for generating a magnetic resonance (MR) image comprising:

acquiring calibration data using each of a plurality of RF source coils in a magnetic resonance imaging system;

generating calibration data for a virtual coil based on the calibration data from the plurality of RF source coils;

generating a set of synthesis weights based on the calibration data from the plurality of RF source coils and the calibration data for the virtual coil;

accessing accelerated MR data associated with the plurality of RF source coils;

generating a complete MR data set for the virtual coil based only on the accelerated MR data associated with the plurality of RF source coils and the set of synthesis weights;

reconstructing an image based on the complete MR data set for the virtual coil; and displaying the image on a display device.

27. A method according to claim 26, wherein the accelerated MR data associated with the plurality of MR source coils includes accelerated MR data acquired from the plurality of RF source coils and accelerated MR data synthesized from the acquired accelerated MR data.

28. A method according to claim 27, wherein generating a complete MR data set for the virtual coil comprises applying the set of synthesis weights to at least a portion of the synthesized accelerated MR data.

29. A method according to claim 27, wherein generating a complete MR data set for the virtual coil comprises applying the set of synthesis weights to at least a portion of the acquired accelerated MR data.

30. A method according to claim 27, wherein generating a complete MR data set for the virtual coil comprises applying the set of synthesis weights to at least a portion of the synthesized accelerated MR data and at least a portion of the acquired accelerated MR data.

* * * * *